US006949327B2

(12) United States Patent
Zheng et al.

(10) Patent No.: US 6,949,327 B2
(45) Date of Patent: Sep. 27, 2005

(54) ON-PRESS DEVELOPABLE LITHOGRAPHIC PRINTING PLATE

(75) Inventors: Shiying Zheng, Webster, NY (US); Elizabeth Knight, Lafayette, CO (US); S. Peter Pappas, Juno Beach, FL (US)

(73) Assignee: Kodak Polychrome Graphics LLC, Norwalk, CT (US)

( * ) Notice: Subject to any disclaimer, the term of this patent is extended or adjusted under 35 U.S.C. 154(b) by 26 days.

(21) Appl. No.: 10/615,665

(22) Filed: Jul. 9, 2003

(65) Prior Publication Data

US 2005/0008958 A1 Jan. 13, 2005

(51) Int. Cl.$^7$ ................................................ G03F 7/038

(52) U.S. Cl. ................. 430/284.1; 430/138; 430/286.1; 430/302; 430/309; 430/434; 430/435; 430/494; 430/944; 430/945

(58) Field of Search ............................. 430/138, 270.1, 430/281.1, 283.1, 284.1, 286.1, 302, 309, 434, 435, 494, 944, 945

(56) References Cited

U.S. PATENT DOCUMENTS

| | | | | |
|---|---|---|---|---|
| 5,948,599 A | | 9/1999 | Gardner et al. | |
| 6,171,748 B1 | * | 1/2001 | Tanaka et al. | 430/138 |
| 6,479,203 B1 | * | 11/2002 | Tashiro et al. | 430/104 |
| 6,653,050 B2 | * | 11/2003 | Fujimaki et al. | 430/281.1 |
| 6,794,104 B2 | * | 9/2004 | Tashiro | 430/138 |
| 2002/0009671 A1 | | 1/2002 | Gries et al. | |
| 2002/0136987 A1 | | 9/2002 | Oshima | |
| 2002/0142244 A1 | * | 10/2002 | Takashima et al. | 430/138 |

FOREIGN PATENT DOCUMENTS

| | | | |
|---|---|---|---|
| EP | 0514145 | A1 | 11/1992 |
| EP | 0599510 | B1 | 4/1997 |
| EP | 0770494 | B1 | 5/2000 |
| EP | 1075942 | A2 | 2/2001 |
| EP | 1080884 | A1 | 3/2001 |
| EP | 1195646 | A1 | 4/2002 |
| EP | 1203660 | A1 | 5/2002 |
| EP | 1092555 | B1 | 8/2002 |
| EP | 0931647 | B1 | 4/2003 |
| JP | 10-282661 | | 10/1998 |
| JP | 10-319591 | | 12/1998 |
| JP | 11-348446 | | 12/1999 |
| JP | 2000-275834 | | 10/2000 |
| JP | 2001-047755 | | 2/2001 |
| JP | 2001-310566 | | 11/2001 |
| JP | 2002-002135 | | 1/2002 |
| JP | 2002-211152 | | 7/2002 |
| JP | 2002-225451 | | 8/2002 |
| JP | 2002-251004 | | 9/2002 |
| JP | 2002-251008 | | 9/2002 |
| JP | 2002-283757 | | 10/2002 |
| JP | 2002-283758 | | 10/2002 |
| WO | WO 98/51496 | | 11/1998 |

* cited by examiner

*Primary Examiner*—Barbara L. Gilliam
(74) *Attorney, Agent, or Firm*—Ratner Prestia

(57) ABSTRACT

Thermally imageable elements useful as on-press developable lithographic printing plate precursors are disclosed. The elements comprise a substrate and a layer of an imageable composition over the substrate. The imageable composition comprises a photothermal conversion material, particles of a polyurethane polymer, and, optionally, a water soluble polymer. The polyurethane polymer comprises urethane linkages in the main chain, but does not comprise side chain urethane groups.

40 Claims, No Drawings

ON-PRESS DEVELOPABLE LITHOGRAPHIC PRINTING PLATE

FIELD OF THE INVENTION

This invention relates to imageable elements. In particular, this invention relates thermally imageable elements useful as on-press developable lithographic printing plate precursors.

BACKGROUND OF THE INVENTION

In conventional lithographic printing, ink receptive regions, known as image areas, are present on a hydrophilic surface. When the surface is moistened with water and ink is applied, the hydrophilic regions retain the water and repel the ink, and the ink receptive regions accept the ink and repel the water. The ink is transferred to the surface of a material upon which the image is to be reproduced. Typically, the ink is first transferred to an intermediate blanket, which in turn transfers the ink to the surface of the material upon which the image is to be reproduced.

Imageable elements useful as lithographic printing plate precursors typically comprise a layer of an imageable composition applied over the hydrophilic surface of a substrate. The layer of imageable composition typically comprises one or more radiation-sensitive components, which may be dispersed in a suitable binder. Alternatively, the radiation-sensitive component can also be the binder material. If, after imaging, the imaged regions of the layer of imageable composition are removed to reveal the underlying hydrophilic surface of the substrate, the precursor is positive working. Conversely, if the unimaged regions are removed, the precursor is negative-working. In each instance, the regions that remain (i.e., the image areas) are ink-receptive, and the revealed regions of the hydrophilic surface accept water and aqueous solutions, typically a fountain solution, and repel ink.

Imageable elements useful as on-press developable lithographic printing plate precursors have been disclosed in the literature. Such elements can be directly mounted on a press after imaging and developed with ink and/or fountain solution during the initial press operation. A separate development step before mounting on press is not required. On-press developable lithographic printing plate precursors are discussed, for example, in Teng, U.S. Pat. No. 6,071,675, column 2, line 47, to column 3, line 17.

Imaging of the imageable element with ultraviolet and/or visible radiation is, typically carried out through a mask, which has clear and opaque regions. Imaging takes place in the regions under the clear regions of the mask but does not occur in the regions under the opaque regions. If corrections are needed in the final image, a new mask must be made. This is a time-consuming process. In addition, dimensions of the mask may change slightly due to changes in temperature and humidity. Thus, the same mask, when used at different times or in different environments, may give different results and could cause registration problems.

Direct digital imaging, which obviates the need for imaging through a mask, is becoming increasingly important in the printing industry. Imageable elements for the preparation of lithographic printing plates have been developed for use with infrared lasers. Despite the progress in conventional on-press developable plates and digital laser imaginable plates, there is a desire for a lithographic plate precursor that can be imaged by infrared laser, does not produce ablation debris, and does not require a separate liquid development process. More specifically, there is a desire for thermally imageable elements that are on-press developable with ink and/or fountain solution.

SUMMARY OF THE INVENTION

In one aspect, the invention is an, imageable element comprising:

a substrate; and a layer of an imageable composition over the substrate; in which:

the imageable composition comprises:

a photothermal conversion material, and particles of a polyurethane polymer;

the polyurethane polymer comprises urethane linkages in the main chain; and the polyurethane polymer does not comprise side chain urethane groups.

In another aspect, the invention is a method for forming an image useful as a lithographic printing plate by imaging the imageable element and developing the imaged imageable element with ink and/or fountain solution.

DETAILED DESCRIPTION OF THE INVENTION

Unless the context indicates otherwise, in the specification and claims, the terms diisocyanate, photothermal conversion material, polyurethane polymer, binder, dihydroxy compound, diisocyanate, and similar terms include mixtures of such materials. Unless otherwise specified, all percentages are percentages by weight. Thermal imaging refers to imaging either with a hot body or with an infrared laser.

Imageable Element

The imageable element comprises a layer of an imageable composition over a support. The imageable composition comprises a photothermal conversion material and particles that comprise a polyurethane polymer. A water soluble binder may also be present. Typically, the layer of imageable composition has a dry coating weight of about 0.5 to about 4 $g/m^2$, preferably 0.7 to 3 $g/m^2$.

Polyurethane Polymer Particles

The polyurethane polymer has urethane groups in the polymer backbone. The polyurethane polymer does not have side chain urethane groups or linkages. In one aspect of the invention, the polyurethane polymer is not crosslinked. Preferably, at least one of the ends of the polyurethane polymer is an isocyanate group. More preferably, both ends are isocyanate groups. The terminal isocyanate group or groups may be capped with blocking groups or converted to amine groups by aqueous treatment.

The polyurethane polymer may be prepared by reaction of a diisocyanate or a dimer or adduct thereof, with a dihydroxy compound. Diisocyanates can be represented by the formula $Y(NCO)_2$, in which Y is a substituted or unsubstituted bivalent aliphatic or aromatic group. Any diisocyanate may be used to prepare the polyurethane polymer. Examples of useful diisocyanates include aliphatic and cycloaliphatic diisocyanates, such as 4,4-methylenebisdicyclohexyl diisocyanate (hydrogenated MDI), 1,4-tetramethylene diisocyanate, 1,6-hexamethylene diisocyanate (HDI), isophorone diisocyanate (IPDI), methylenebis(cyclohexyl isocyanate), trimethyl hexamethylene diisocyanate (TMDI), meta-tetramethylxylylene diisocyanate (TMXDI), and 1,4-cyclohexyl diisocyanate; aromatic diisocyanates, such as tolylene diisocyanate (TDI) (i.e., 2,4-tolylene diisocyanate, 2,6-tolylene diisocyanate, or a mixture thereof), 4,4-diphenylmethane diisocyanate (MDI), 2,4'-diphenylmethane diisocyanate, 2,2'-diphenylmethane diisocyanate, 4,4'-diphenyl ether diisocyanate, naphthalene-1,5-diisocyanate (NDI), 3,3-dimethyl-4,4-biphenylene diisocyanate (TODI), crude TDI (i.e., a mixture of TDI and an oligomer thereof), polymethylenepolyphenyl polyisocyanate, crude MDI (i.e., a mixture of MDI and an oligomer thereof), xylylene diisocyanate (XDI), tetramethyl xylylene diisocyanate, and phenylene diisocyanate; and dimers thereof, adducts thereof with diols, and mixtures thereof. A preferred diisocyanate is isophorone diisocyanate.

Typical dihydroxy compounds include for example: aromatic compounds having two hydroxyl groups, such as hydroquinone, resorcinol, catechol, methylhydroquinone, ethylhydroquinone, 2,3-dimethylhydroquinone, 2,4-dihydroxybenzoic acid, 3,5-dihydroxybenzoic acid, 1,5-dihydroxynaphthalene, and 2,6-dihydroxynaphthalene; bisphenols, such as 4,4'-dihydroxybiphenyl (4,4'-diphenol), 2,2'-dihydroxybiphenyl (2,2'-diphenol), bisphenol A (2,2-bis (4-hydroxyphenyl)propane), bisphenol AF (1,1,1,3,3,3,-hexafluro-2,2-bis(4-hydroxyphenyl)propane), bisphenol E (2,2-bis(4-hydroxyphenyl)ethane), and 4,4'-dihydroxybenzophenone; diols, such as ethylene glycol, diethylene glycol, triethylene glycol, polyethylene glycol, 1,2-propanediol, 1,3-propaone diol, 1,2-butanediol, 1,4-butanediol, 2,2-dimethyl-1,3-propanediol (neopentyl glycol), 1,5-pentanediol, 2-methyl-1,5-pentanediol, 3-methyl-1,5-pentanediol, 1,6-hexanediol, 1,8-octanediol, 1,9-nonanediol, 2,2-diethyl-1,3-propanediol, 2-n-butyl-2-ethyl-1,3-propanediol, 2,2,4-trimethyl-1,3-pentanediol, 2-ethyl-1,3-hexanediol, and 1,2-cyclohexanediol; and carboxyl functional diols, for example, dialkanol alkanoic acids, such as 2,2-bis(hydroxymethyl) propionic acid (2,2-dimethylol propanoic acid), 2,2-bis(2-hydroxyethyl) propionic acid, 2,2-bis(3-hydroxypropyl) propionic acid, bis (hydroxymethyl)acetic acid, bis(4-hydroxyphenyl)acetic acid, 2,2-bis(hydroxymethyl) butyric acid, 2,2-bis (hydroxymethyl) pentanoic acid, and tartaric acid; dihydroxybenzoic acids such as 3,5-dihydroxybenzoic acid; and dihydroxy dicarboxylic acids derived from the reaction of dianhydrides with diols, such as the reaction product of a dianhydride such as pyromellitic dianhydride, 3,3',4,4'-benzophenone tetracarboxylic dianhydride, 3,3',4,4'-diphenyl tetracarboxylic dianhydride, or 2,3,6,7-naphthalene tetracarboxylic dianhydride with a diol such as those listed above.

Mixtures of dihydroxy compounds may be used. Typical mixtures comprise about 1–25% of a carboxy functional diol or a mixture of carboxy functional diols, with the remainder of the mixture comprising an aromatic diol or mixture of aromatic diols and/or an aliphatic diol or mixture of aliphatic diols. Preferably, the dihydroxy compound comprises about 3–15% of a carboxy functional diol or a mixture of carboxy functional diols, about 0–50% of an aromatic diol or mixture of aromatic diols, and about 35–97% of an aliphatic diol or a mixture of aliphatic diols.

The polyurethane polymers may be prepared by conventional methods. The diisocyanate or mixture of diisocyanates and the dihydroxy compound or mixture of dihydroxy compounds are mixed together in a solvent. The solvent should not react with the diisocyanate and should not contain impurities, such as water, that can react with the diisocyanate. Suitable solvents include, for example, methyl acetate, ethyl acetate, amyl acetate, acetone, methyl ethyl ketone, diethyl ketone, 4-methyl-2-pentanone, dimethyl formamide, dioxane, and methyl pyrrolidone. The reaction is carried out under anhydrous conditions, typically at about 40° C. to about 90° C. for several hours. A catalyst, such as about 0.5% or less, typically about 0.04% of, for example, dibutyl tin dilaurate may be added.

The polyurethane polymer may, or may not, comprise blocking groups. If no blocking groups are to be present in the polyurethane polymer, equimolar amounts of the diisocyanate or mixture of diisocyanates and the dihydroxy compound or mixture of dihydroxy compounds are mixed together in the solvent.

Blocking agents include, for example, alcohols such as, methanol, ethanol; and 2-propanol; glycol ethers, such as 2-methoxyethanol, 2-ethoxyethanol, 2-(2-methoxy) ethoxyethanol, and 3-ethoxyethanol; phenols, such as, phenol and cresols; oximes, for example, $C_2$ to $C_8$ alkanone oximes, such as, acetone oxime and butanone oxime, and benzophenone oxime; thiophenols; organic carbanion active hydrogen compounds, such as diethyl malonate, acetylacetone, ethyl acetoacetate, and ethyl cyanoacetate; and primary and secondary amines, such as butyl amine, diethyl amine, and 3-amino-1,2,4-triazole; and hydroxylamine.

If blocking groups are to be present in the polyurethane polymer, an about 10% molar excess of the diisocyanate or mixture of diisocyanates is used. After the reaction of the diisocyanate or mixture of diisocyanates with the dihydroxy compound or mixture of dihydroxy compounds is essentially complete, the blocking agent is added and heating continued for several hours. Alternatively, if amino end groups are desired, the mixture can be subjected to an aqueous treatment, such as an aqueous workup, after the reaction of the diisocyanate or mixture of diisocyanates with the dihydroxy compound or mixture of dihydroxy compounds is essentially complete.

To form particles of the polyurethane polymer, additional solvent, if necessary, is added to the reaction mixture to form a clear solution of the polymer. The resulting polymer solution is washed with base and with water. Then a volume of water about equal to the volume of the polymer solution and, optionally, a surfactant, is added and the resulting mixture passed through a high shear device such as a high speed mixer, chemical blender, high pressure homogenizer, or microfluidizer. The solvent in which the polymer is dissolved is evaporated to give an aqueous dispersion of polyurethane polymer particles.

The particles typically have a diameter of 0.001–1 micrometers, preferably a diameter of 0.01–0.5 micrometers.

Photothermal Conversion Material

The imageable element comprises an infrared absorber, known as a photothermal conversion material. Photothermal conversion materials absorb radiation and convert it to heat. Although a photothermal conversion material is not necessary for imaging with a hot body, imageable elements that contain a photothermal conversion material may also be imaged With a hot body, such as a thermal head or an array of thermal heads.

The photothermal conversion material may be either a dye or pigment, such as a dye or pigment of the squarylium, merocyanine, indolizine, pyrylium, or metal diothiolene class. Examples of absorbing pigments are Projet 900, Projet 860 and Projet 830 (all available from the Zeneca Corporation), and carbon black. The photothermal conversion material may be, for example, an indoaniline dye, an oxonol dye, a porphyrin derivative, an anthraquinone dye, a merostyryl dye, a pyrylium compound, or a squarylium derivative with the appropriate absorption spectrum and solubility.

Dyes, especially dyes with a high extinction coefficient in the range of 750 nm to 1200 nm, are preferred. Absorbing dyes are disclosed in numerous publications, for example, Nagasaka, EP 0,823,327; DeBoer, U.S. Pat. No. 4,973,572; Jandrue, U.S. Pat. No. 5,244,771; and Chapman, U.S. Pat. No. 5,401,618. Examples of useful cyanine dyes include: 2-[2-[2-phenylsulfonyl-3-[2-(1,3-dihydro-1,3,3-trimethyl-2H-indol-2-ylidene)-ethylidene]-1-cyclohexen-1-yl]-ethenyl]-1,3,3-trimethyl-3H-indolium chloride; 2-[2-[2-thiophenyl-3-[2-(1,3-dihydro-1,3,3-trimethyl-2H-indol-2-ylidene)-ethylidene]-1-cyclohexen-1-yl]-ethenyl]-1,3,3-trimethyl-3H-indolium chloride; 2-[2-[2-thiophenyl-3-[2-(1,3-dihydro-1,3,3-trimethyl-2H-indol-2-ylidene)-ethylidene]-1-cyclopenten-1-yl ]-ethenyl]-1,3,3-trimethyl-3H-indolium tosylate; 2-[2-[2-chloro-3-[2-ethyl-(3H-benzthiazole-2-ylidene)-ethylidene]-1-cyclohexen-1-yl]-ethenyl]-3-ethyl-benzthiazolium tosylate; and 2-[2-[2-chloro-3-[2-(1,3-dihydro-1,3,3-trimethyl-2H-indol-2-ylidene)-ethylidene]-1-cyclohexen-1-yl]-ethenyl]-1,3,3-trimethyl-3H-indolium tosylate. Other examples of useful absorbing dyes include: ADS-830A and ADS-1064 (American Dye Source, Montreal, Canada), EC2117 (FEW, Wolfen, Germany), Cyasorb IR 99 and Cyasorb IR 165 (Glendale Protective Technology), Epolite IV-62B and Epolite III-178 (Epoline), PINA-780 (Allied Signal), SpectralR 830A and SpectralR 840A (Spectra Colors), as well as IR Dye A, and IR Dye B.

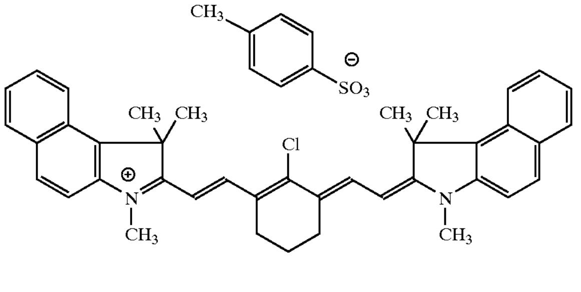

IR Dye A

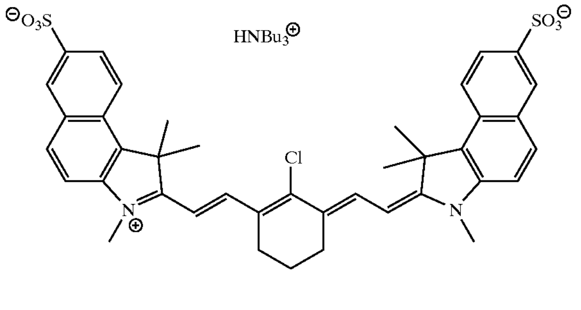

IR Dye B

Other useful photothermal conversion materials include infrared absorbers of Structure I, Structure II, and Structure III. These photothermal conversion materials absorb in two different regions of the infrared spectrum so elements that comprise these materials can be imaged with imaging devices that contain lasers that emit either at about 830 nm, at about 1056 nm, or at about 1064 nm.

STRUCTURE I

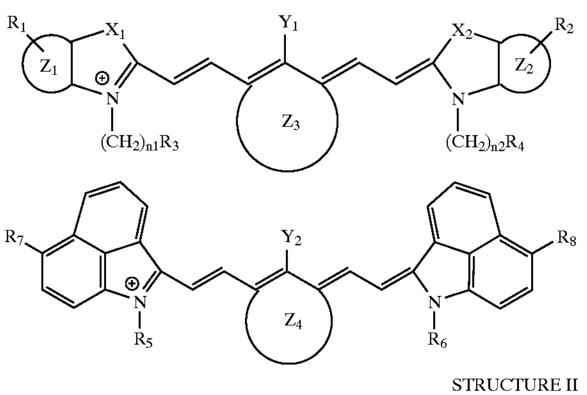

STRUCTURE II

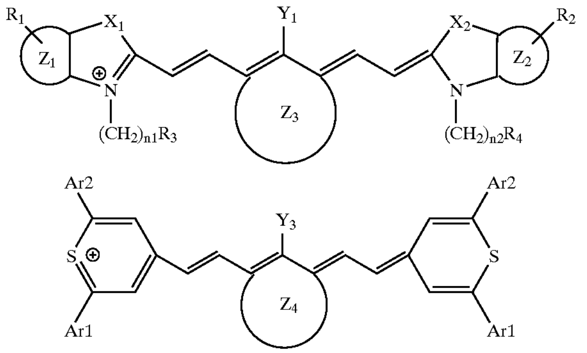

STRUCTURE III

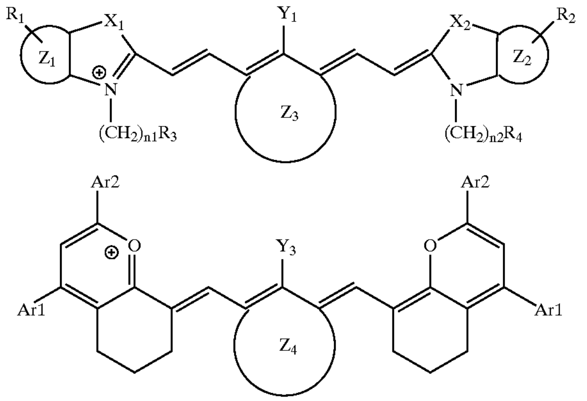

in which:

$Y_1$, $Y_2$, and $Y_3$ are each independently hydrogen, halo, alkyl, phenyl, substituted phenyl, phenylamino, diphenylamino, or phenylthio, preferably phenyl, hydrogen, chloro, phenylthio, or diphenylamino;

$R_1$, $R_2$, $R_3$, and $R_4$ are each independently hydrogen, alkyl, preferably methyl or ethyl, or $SO_3^-$, with the proviso that two of $R_1$, $R_2$, $R_3$, and $R_4$ are $SO_3^-$;

$R_5$ and $R_6$ are each independently alkyl, aryl, aralkyl, hydroxyalkyl, alkoxyalkyl, aminoalkyl, carboxyalkyl, or sulfoalkyl;

$R_7$ and $R_8$ are each independently hydrogen, alkyl, preferably alkyl of one to four carbon atoms, or halo, preferably chloro;

$Ar_1$ and $Ar_2$ are each independently phenyl or substituted phenyl, preferably phenyl;

$Z_1$, and $Z_2$ are each independently a benzo group or a naphtho group;

$Z_3$ and $Z_4$ are each independently two hydrogen atoms, a cyclohexene residue, or a cyclopentene residue;

$X_1$ and $X_2$ are each independently S, O, NH, $CH_2$, or, preferably, $C(CH_3)_2$; and $n_1$ and $n_2$ are each independently 0 to 4, preferably 1 to 4.

Infrared absorbers of Structure I, Structure II, or Structure III may be prepared by mixing a solution of a salt that contains the desired cation with a solution of a salt that contains the desired anion and filtering off the resulting precipitate. The anion of the salt that contains the desired cation is typically, for example, a sulfate, bisulfate, or halide, such as chloride or bromide. The cation of the salt that contains the desired anion is typically ammonium, substituted ammonium such as trimethyl ammonium or tri-n-butyl ammonium, lithium, sodium, or potassium. The solvent may be water or a solvent including a mixture of water and a hydrophilic solvent such an as alcohol, for example methanol, ethanol, or propylene glycol methyl ether.

The amount of infrared absorber in the imageable composition is generally sufficient to provide an optical density of at least 0.05, and preferably, an optical density of from about 0.5 to at least about 2 to 3 at the imaging wavelength. As is well known to those skilled in the art, the amount of compound required to produce a particular optical density can be determined from the thickness of the underlayer and the extinction coefficient of the infrared absorber at the wavelength used for imaging using Beer's law.

Other Ingredients

Optionally, the imageable layer may also comprise a water soluble polymer, or binder. For water solubility, the binder should not be cross-linked. Typical water soluble polymers are polyvinyl alcohol and its water soluble derivatives and co-polymers, such as partially hydrolyzed polyvinyl acetate and ethylene/vinyl alcohol co-polymers; poly (meth)acrylic acid; poly(meth)acrylamide; polyacrylamide, polyacrylic acid, polyhydroxyethyl(meth)acrylate; polyvinylmethylether; polyethylene oxide; poly-N-vinyl pyrrolidone, polyvinyl imidazole, polyvinyl pyrazole, polyacrylamide, polyacrylic acid, and water soluble derivatives and copolymers thereof, gelatin, and cellulose derivatives such as hydroxyalkyl cellulose and carboxymethyl cellulose. Preferred water soluble polymers are polyvinyl alcohol and its water soluble derivatives and co-polymers.

Other ingredients that are conventional components of imageable compositions, such as dyes and surfactants, may be present. Surfactants may be present in the imageable composition as, for example, coating aids. A dye may be present to aid in the visual inspection of the imaged and/or developed element. Printout dyes distinguish the imaged regions from the unimaged regions during processing. Contrast dyes distinguish the unimaged regions from the imaged regions in the developed imageable element. Preferably, the dye does not absorb the imaging radiation. Triarylmethane dyes, such as ethyl violet, crystal violet, malachite green, brilliant green, Victoria blue B, Victoria blue R, Victoria pure blue BO, and D11 (PCAS, Longjumeau, France), may act as the contrast dye.

Composition

When a water soluble polymer or mixture of water soluble polymers is not present, the imageable layer typically comprises about 80% to about 99%, preferably about 85% to about 95%, of the polyurethane particles, based on the dry weight of the particles; typically about 0.01% to about 5%, preferably about 0.1% to about 1%, of the surfactant or mixture of surfactants; and typically about 0.5% to about 20%, preferably about 1% to about 15%, of the infrared absorber or mixture of infrared absorbers.

When a water soluble polymer or mixture of water soluble polymers is present, the imageable layer typically comprises about 60% to about 95%, preferably about 70% to about 90%, of the polyurethane particles, based on the dry weight of the particles; typically about 0.01% to about 5%, preferably about 0.1% to about 1%, of the surfactant of mixture of surfactants; typically about 0.5% to 20%, preferably about 1% to about 15%, of the infrared absorber or mixture of infrared absorbers; and typically about 3% to 30%, preferably about 5% to about 20%, of the water soluble polymer or mixture of water soluble polymers.

Substrate

The imageable composition is coated over a substrate. The substrate comprises a support, which may be any material conventionally used to prepare imageable elements useful as lithographic printing plates. The support is preferably strong, stable and flexible. It should resist dimensional change under conditions of use so that color records will register in a full-color image. Typically, it can be any self-supporting material, including, for example, polymeric films such as polyethylene terephthalate film, ceramics, metals, or stiff papers, or a lamination of any of these materials. Metal supports include aluminum, zinc, titanium, and alloys thereof.

Typically, polymeric films contain a sub-coating on one or both surfaces to modify the surface characteristics to enhance the hydrophilicity of the surface, to improve adhesion to subsequent layers, to improve planarity of paper substrates, and the like. The nature of this layer or layers depends upon the substrate and the composition of subsequent coated layers. Examples of subbing layer materials are adhesion-promoting materials, such as alkoxysilanes, aminopropyltriethoxysilane, glycidoxypropyltriethoxysilane and epoxy functional polymers, as well as conventional subbing materials used on polyester bases in photographic films.

The surface of an aluminum support may be treated by techniques known in the art, including physical graining, electrochemical graining, chemical graining, and anodizing. The substrate should be of sufficient thickness to sustain the wear from printing and be thin enough to wrap around a printing form, typically from about 100 $\mu$m to about 600 $\mu$m. Typically, the substrate comprises an interlayer between the aluminum support and the layer of imageable composition. The interlayer may be formed by treatment of the support with, for example, silicate, dextrine, hexafluorosilicic acid, phosphate/fluoride, polyvinyl phosphonic acid (PVPA), or vinyl phosphonic acid copolymers.

The back side of the substrate (i.e., the side opposite the underlayer and layer of imageable composition) may be coated with an antistatic agent and/or a slipping layer or matte layer to improve handling and "feel" of the imageable element.

Preparation of the Imageable Elements

The imageable element may be prepared by applying the layer of imageable composition over the surface of the substrate using conventional techniques. The terms "coating solvent" and "coating solution" are used although some or all of the materials are be suspended or dispersed in the solvent rather than in solution. The aqueous dispersion of the particles of polyurethane polymer, the photothermal conversion material, and, if present, the water soluble polymer and/or any other ingredients, are dissolved and/or dispersed in water to form the coating solution. Other solvents that have at least some solubility with water, such as 1-propanol, may be added to improve coating cosmetics and/or improve the solubility of the components, such as the infrared absorber, in the coating solution. The coating solution is coated onto the substrate by conventional methods, such as spin coating, bar coating, gravure coating, die coating, or roller coating. The water and any other solvents, if present, are evaporated to produce the imageable element.

If desired, a protective overcoat that is removable by ink and/or fountain solution, such as a layer of polyvinyl alcohol, may be coated over the layer of imageable composition. The protective overcoat protects the element during storage and handling, but is removed by ink and/or fountain solution, following imaging.

Imaging and Processing

The element may be thermally imaged with a laser or an array of lasers emitting modulated near infrared or infrared radiation in a wavelength region that is absorbed by the imageable element. Infrared radiation, especially infrared radiation in the range of about 800 nm to about 1200 nm, is typically used for imaging. Imaging is conveniently carried out with a laser emitting at about 830 nm, about 1056 nm, or about 1064 nm. Alternatively, the imageable element may be thermally imaged using a hot body, such as a conventional apparatus containing a thermal printing head. Following imaging, it is developed on-press. For on-press development, good quality prints should be obtained preferably under 20 initial impressions, and more preferably under 5 impressions.

The imageable element may be imaged off press or on press. For off press imaging, suitable commercially available imaging devices include image setters such as the Creo Trendsetter (CREO, Burnaby, British Columbia, Canada), the Screen PlateRite model 4300 and model 8600 (Screen, Rolling Meadows, Chicago, Ill., USA), and the Gerber Crescent 42T (Gerber). For off press imaging with a hot body, the apparatus typically includes a thermal head array, such as a TDK Model No. LV5416 used in thermal fax machines and sublimation printers or the GS618–400 thermal plotter (Oyo Instruments, Houston, Tex., USA).

In conventional wet press lithographic printing, fountain solution and then ink are applied to the printing plate. For presses with integrated inking/dampening system, the ink and fountain solution are emulsified by various press rollers before being transferred to the plate as emulsion of ink and fountain solution. However, in this invention, the ink and fountain solution may be applied in any combination or sequence, as needed for the plate. Typical ingredients of aqueous fountain solutions, in addition to water, typically deionized water, include pH buffering systems, such as phosphate and citrate buffers; desensitizing agents, such as dextrin, gum arabic, and sodium carboxymethylcellulose; surfactants and wetting agents, such as aryl and alkyl sulfonates, polyethylene oxides, polypropylene oxides, and polyethylene oxide derivatives of alcohols and phenols; humectants, such as glycerin and sorbitol; low boiling solvents such as ethanol and 2-propanol; sequestrants, such as borax, sodium hexametaphosphate, and salts of ethylenediamine tetraacetic acid; biocides, such as isothiazolinone derivatives; and antifoaming agents. Numerous aqueous fountain solutions are known to those skilled in the art. Fountain solutions are disclosed, for example, in Matsumoto, U.S. Pat. No. 5,720,800; Archer, U.S. Pat. No. 5,523,194; Chase, U.S. Pat. No. 5,279,648; Bondurant, U.S. Pat. Nos. 5,268,025, 5,336,302, 5,382,298, Egberg, U.S. Pat. No. 4,865,646; and Daugherty, U.S. Pat. No. 4,604,952.

Lithographic printing inks typically comprise a colorant or mixture of colorants, a vehicle, a solvent, and one or more additives, such as dispersing agents. The inks are hydrophobic so they will be taken up by the hydrophobic regions of the printing plate and are typically quite viscous. Typical colorants are dyes and pigments, such as carbon black. Typical vehicles include, for example, natural and processed resins such as drying oil, synthetic drying oil, rosin, copal, dammer, shellac, hardened rosin and rosin esters, phenolic resins, rosin modified phenolic resins, maleic acid resins, alkyd resins, acrylic resins, polyamide resins, epoxy resins, aminoalkyd resins, and polyurethane resins. Typical solvents include turpentine, mineral spirits, short chain esters, that is esters derived from aliphatic acids having 2 to 6 carbon atoms and aliphatic alcohols having 2 to 6 carbon atoms, such as amyl acetate, and mixtures thereof. The solvent typically has a boiling point of about 75° C. to about 200° C. so that it will not evaporate too quickly from the ink containing the vehicle. Lithographic printing inks are commercially available from a number of suppliers, including, for example, Sun Chemical Ink, Northlake, Ill., USA; Flint Ink, Ann Arbor, Mich., USA; Graphic Ink Company Inc., Salt Lake City, Utah., USA; Gans Ink & Supply Co, Los Angeles, Calif., USA; and Van Son Holland Ink Corporation, Holland.

Imaging produces an imaged element, which comprises a latent image of imaged regions and complementary unimaged regions. The imaged imageable element is mounted on the plate cylinder of a lithographic press and developed with ink and/or fountain solution by rotating the press cylinders and contacting the plate with ink and/or fountain solution. The unimaged regions of the imaged imageable element are removed by the ink and/or fountain solution For on-press imaging, the imageable element is imaged while mounted on a lithographic printing press cylinder, and the imaged imageable element is directly developed on press with ink and/or fountain solution during initial press operation. This is especially suitable for computer-to-press application in which the imageable element (or elements, for multiple color press) is directly imaged on the plate cylinder according to computer generated digital imaging information and, with minimum or no treatment, directly prints out regular printed sheets. On-press imaging may be carried out, for example on a Speedmaster 74 DI press or a Quickmaster DI 46-4 press (Heidelberger Druckmaschinen, Heidelberg, Germany).

INDUSTRIAL APPLICABILITY

The imageable elements are useful on-press developable lithographic printing plate precursors. Once the imageable element has been imaged and processed to form a printing plate, printing can be carried out by applying a fountain solution and then a lithographic ink to the image on its surface. Fountain solution is taken up by the surface of the substrate exposed by imaging and development, and the ink is taken up by the complementary regions. The ink is transferred to a suitable receiving material (such as cloth, paper, metal, glass or plastic) either directly or indirectly using an offset printing blanket to provide a desired impression of the image thereon.

The advantageous properties of this invention can be observed by reference to the following examples, which illustrate but do not limit the invention.

EXAMPLES

In the Examples, "coating solution" refers to the mixture of solvent or solvents and additives coated, even though some of the additives may be in suspension rather than in solution. Except where indicated, the indicated percentages are percentages by weight based on the total solids in the coating solution.

Glossary

AIRVOL® 203 Polyvinyl alcohol, about 88 mol % hydrolyzed (Air Products, Allentown, Pa., USA)

AIRVOL® 523 Polyvinyl alcohol, about 88 mol % hydrolyzed (Air Products, Allentown, Pa., USA)

ALCOTEX® 864 Polyvinyl alcohol (Harlow Chemical, Harlow, Essex, UK)

ALCOTEX® 975 Polyvinyl alcohol (Harlow Chemical, Harlow, Essex, UK)

POVAL® KL-506 Functionalized polyvinyl alcohol, 74–80 mol % hydrolyzed (Kuraray, Sakazu Kurashiki City, Japan)

SHAA 85 Oligomeric acrylamide surfactant of the general structure $C_{12}H_{25}S[CH_2CH(CONH_2)]_nH$, in which n is about 10 (Eastman Kodak, Rochester, N.Y., USA)

S-LEC® K K-W1 Polyvinylacetal resin (Sekisui Chemical, Osaka, Japan)

S-LEC® K KW-3 Polyvinylacetal resin (Sekisui Chemical, Osaka, Japan)

ZONYL® FSN Fluorosurfactant (DuPont, Wilmington, Del., USA)

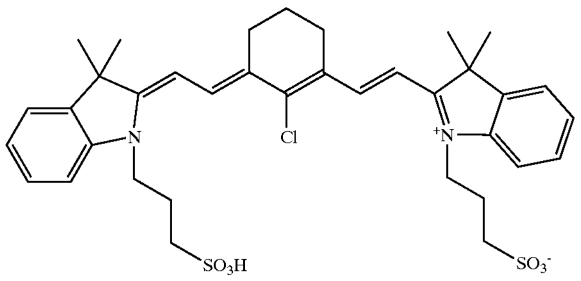

IR Dye I

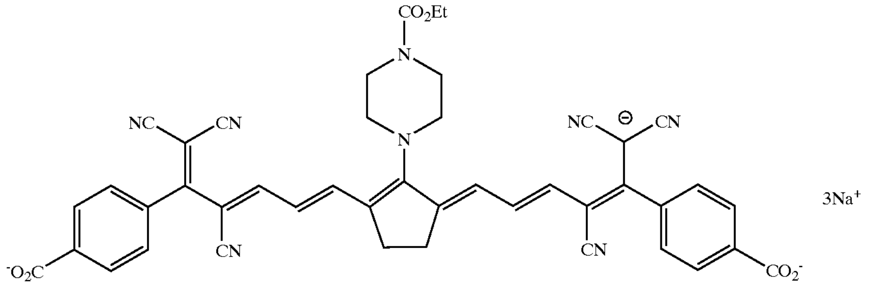

IR Dye II

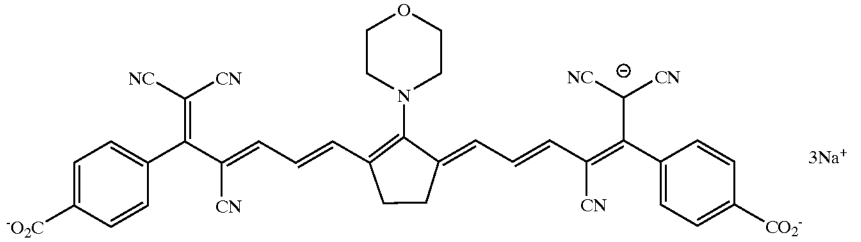

IR Dye III

CAB-O-JET® 200 Surface sulfonated carbon black (Cabot, Boston, Mass., USA)

CAB-O-JET® 300 Surface carboxylated carbon black (Cabot, Boston, Mass., USA)

Copolymer 845 Vinylpyrrolidone copolymer (ISP, Wayne, N.J., USA)

MOWIOL® 3-83 Partially hydrolyzed polyvinyl alcohol, 15% acetate (Clariant, Charlotte, N.C., USA)

MOWIOL® 4–98 Polyvinyl alcohol, about 98% hydrolyzed (Clariant, Charlotte, N.C., USA)

POVAL® C-506 Functionalized polyvinyl alcohol, 75.0–79.0 mol % hydrolyzed; (Kuraray, Sakazu Kurashiki City, Japan)

Synthetic Procedures

1. General Procedure for Synthesis of Polyurethane Dispersion with Monomer Ratio m/n>0, with or without Blocking Groups:

To a round bottom flask were added dimethylol propionic acid (m mol), diethylene glycol (n mol), bisphenol A (p mol), isophorone diisocyanate (1.1 eq to (m+n) mol when there is a blocking group, 1.0 eq to (m+n+p) mol when there is no blocking group), ethyl acetate (to make a mixture of 30% solids), and a catalytic amount of dibutyltin dilaurate. The reaction was heated at reflux overnight. The reaction mixture became slightly hazy. Tetrahydrofuran was added until the reaction mixture became clear.

For polyurethanes with blocking groups, FTIR was used to confirm the presence of isocyanate groups and the polymer was end-capped with 2-butanone oxime (0.2 eq to (m+n) mol) or 3-amino-1,2,4-triazole then refluxed for another 4 hr.

For all polyurethanes, potassium hydroxide (m mol) was dissolved in minimum amount of water and added to the polymer solution. After the resulting mixture was stirred at room temperature for 30 min, a volume of water equal to the volume of the polymer solution was added under vigorous stirring. The milky mixture was passed through a microfluidizer and the organic solvent was evaporated to give a self-dispersed polyurethane.

2. General Procedure for Synthesis of Polyurethane Dispersion with Monomer Ratio m/n=0, with or without Blocking Groups:

To a round bottom flask were added diethylene glycol (n mol), isophorone diisocyanate (1.1 eq to n mol when there is a blocking group, 1.0 eq to n+p mol when there is no blocking group), ethyl acetate (to make a mixture of 30% solids), and a catalytic amount of dibutyltin dilaurate. The reaction was heated at reflux overnight. The reaction mixture became slightly hazy. Tetrahydrofuran was added until the reaction mixture became clear. For polyurethanes with blocking groups, FTIR was used to confirm the presence of isocyanate groups and the reaction was end-capped with 2-butanone oxime (0.2 eq to (n) mol) then refluxed for another 4 hr. For all polymers, the surfactant dioctyl sulfosuccinate sodium (0.65 wt % to organic phase) was added to the polymer solution. A volume of water equal to the volume of the polymer solution, containing 1 wt % of SHAA85, was then added under vigorous stirring. The milky mixture was passed through a microfluidizer and the organic solvent was evaporated to give dispersed polyurethanes.

3. General Procedure for Synthesis of Aqueous Polymer Dispersions with Alternative Backbones:

Synthesis of the monomers: Oxime blocked isocyanate monomers were synthesized by refluxing equal moles of isocyanate and 2-butanone oxime in ether overnight. The solvent was removed and the monomers were obtained.

Synthesis of the polymers: Monomer(s) in toluene (to make a mixture of 20% solids) and AIBN (1 mol % of monomer amount) were degassed by bubbling nitrogen for a few minutes. The solution was then heated to 65° C. overnight. The polymer was precipitated into methanol, filtered and dried.

Preparation of aqueous dispersions: The polymer was dissolved in tetrahydrofuran to make 30% solids, and then 0.65 wt % of the surfactant dioctyl sulfosuccinate sodium was added. A volume of water equal to the polymer solution and containing 1 wt % of SHM 85 was then added under vigorous stirring. The milky mixture was passed through a microfluidizer and the organic solvent was evaporated to give an aqueous dispersion.

Characterization of the polyurethane polymers is shown in Table 1.

TABLE 1

Characterization of Polyurethane Polymers

| Polymer | Tg (° C.) | Mw | Monomer ratio m/n or m/(n + p) | Blocking Group |
|---|---|---|---|---|
| P1 | 118 | 3090 | 25:75 | oxime |
| P2 | 108 | 3640 | 15:85 | oxime |
| P3 | | 3030 | 8:92 | oxime |
| P4 | 95 | 6560 | 5:95 | oxime |
| P5 | 85 | 4630 | 3:97 | oxime |
| P6 | 95 | 24900 | 0:100 | oxime |
| P7 | | 2890 | 5:95 | triazole-amine |
| P8 | 88 | 5600 | 8:92 | none |
| P9 | | 5160 | 5:95 | none |
| P10 | 88 | 8100 | 3:97 | none |
| P11 | 85 | 7930 | 0:100 | none |
| P12 | 101 | 4960 | 5:95 | none |
| P13 | 119 | 2740 | 5:95 | none |
| P14 | 126 | 2070 | 5:95 | none |
| P15 | 121 | 4720 | 0:100 | none |

The structures of the polymer used in the Examples are shown below.

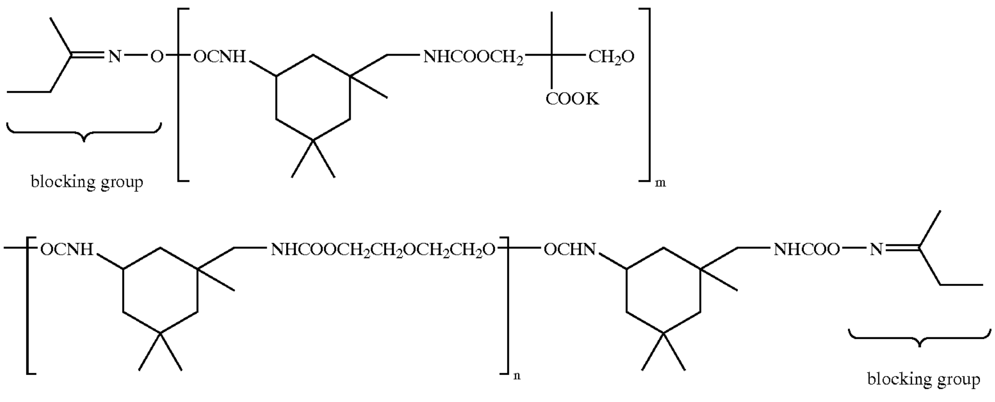

Polymers P1–P6 and P8–P11

-continued
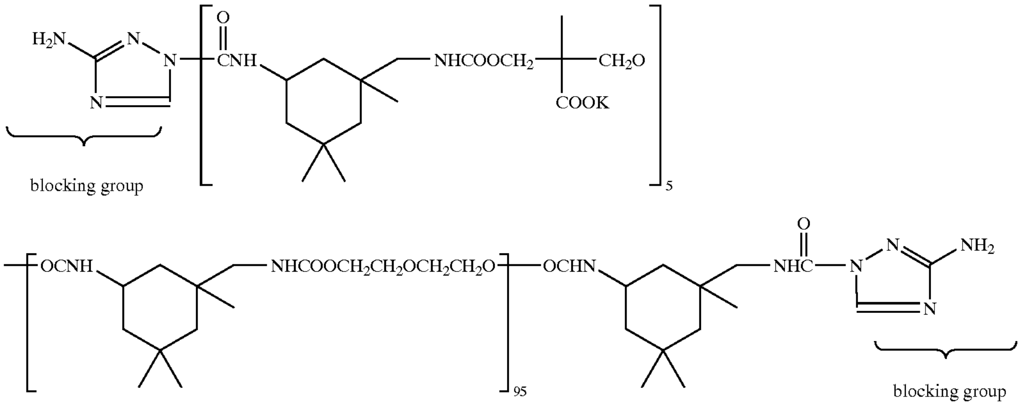
Polymer P7
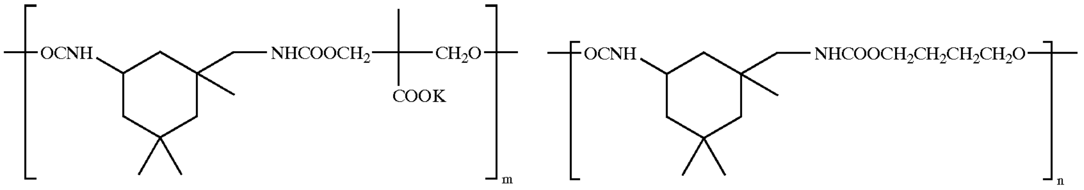
Polymer P12
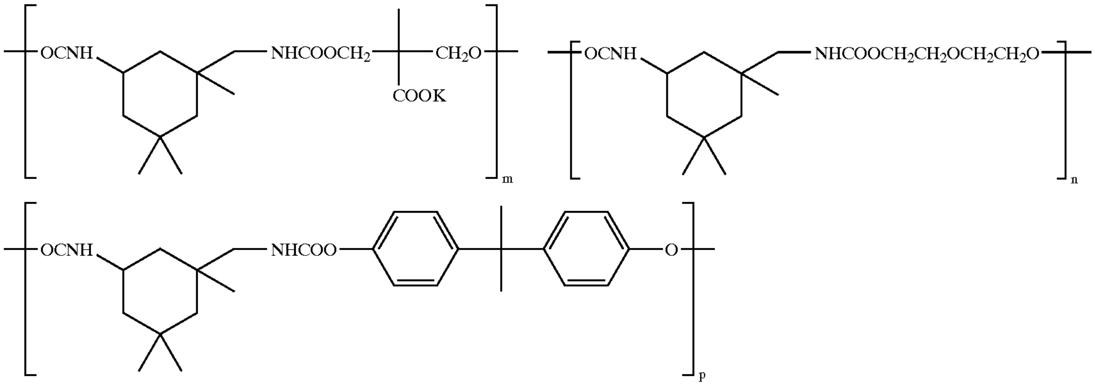
m/m/p= 5/50/45
Polymer P13
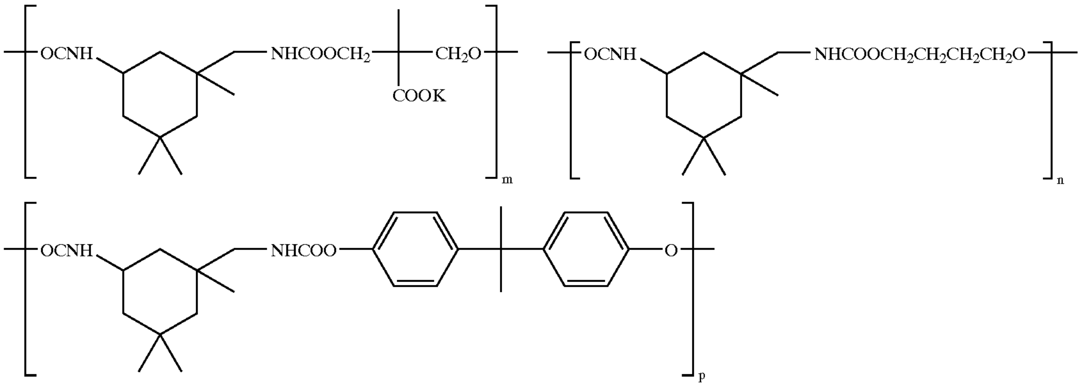
m/n/p = 5/50/45
Polymer P14

-continued

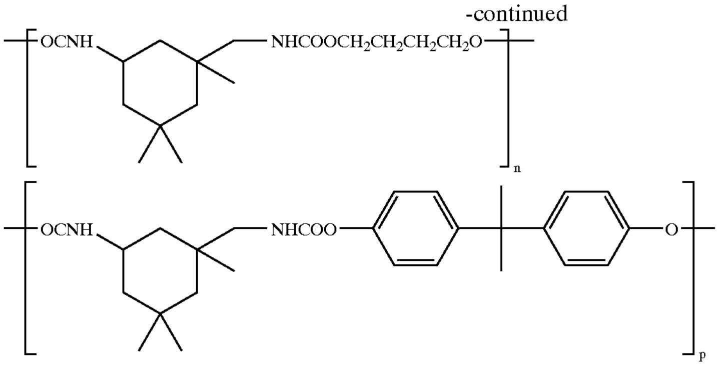

n/p = 50/50
Polymer P15

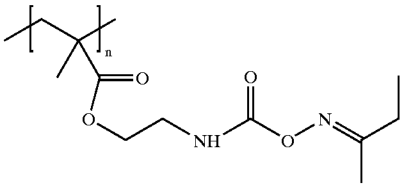

Polymer C1

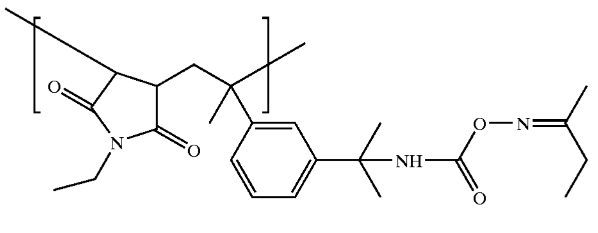

Polymer C2

Examples 1–9 and Comparative Examples 1–2

Coating solutions were prepared with the following composition: 2.8–2.9% polymer; 01–0.03% ZONYL® FSN; 0.3–0.4% IR Dye I infrared absorber; and 96–97% water.

Each coating solution was coated onto a grained and anodized aluminum substrate using a #3 RK wire wound rod. The resulting imageable elements were allowed to air dry. The dry imageable elements were imaged with a Creo Trendsetter 3244 imagesetter (CREO, Burnaby, British Columbia, Canada) at an exposure of 450 $mJ/cm^2$. The imaged imageable elements were placed on an offset printing press with a commercial fountain solution and black ink. The non-image areas were removed after several revolutions of the fountain and/or ink rollers, and good prints were produced by the $25^{th}$ impression. The run length for each of the resulting printing plates is shown in Table 2.

TABLE 2

| Example | Polymer | Number of Impressions |
|---|---|---|
| 1 | P3 | 30,000 |
| 2 | P4 | 40,000 |
| 3 | P5 | 4,000 |
| 4 | P6 | 8,000 |
| 5 | P8 | 35,000 |
| 6 | P9 | 28,000 |
| 7 | P10 | 30,000 |
| 8 | P11 | 5,000 |
| 9 | P12 | 20,000 |

As shown by the results in Table 3, polymers with pendant urethane groups did not provide adequate run length.

TABLE 3

| Example | Polymer | Number of Impressions |
|---|---|---|
| C-1 | C1 | 50 |
| C-2 | C2 | 1,000 |

Examples 10–11

The procedure of Example 2 was repeated except that oxonol dyes IR Dye II and IR Dye III were used in place of the cyanine IR Dye I. The resulting imageable elements were imaged using the Creo Trendsetter 3244 imagesetter at imaging energies of 300, 400, and 500 $mJ/cm^2$. The resulting imaged imageable elements were placed on a duplicator press for 250 impressions. The resulting printing plates produced good prints for all exposures.

Examples 12–15

The procedure of Examples 1–9 was repeated using the polymers of Examples 2 and 6 except CAB-O-JET® 200 and CAB-O-JET® 300 were used in place of the IR Dye I infrared absorber. The resulting imageable elements were imaged as in Example 1 at imaging energies of 300, 450, and 563 $mJ/cm^2$. The resulting imaged imageable elements were placed on a duplicator press for 250 impressions. All four the resulting printing plates produced good prints for all exposures.

Examples 16–24

These examples illustrate imageable compositions that comprise a water-soluble polymeric binder. The coating solutions that include a binder have the following composition by weight percent: 2.8–2.9% polyurethane (dry weight); 0.3–0.6% binder (dry weight); 0.2–0.4% IR Dye I infrared absorber; 0.01–0.03% surfactant; and 96–97% water. Each coating solution was coated onto a grained and anodized aluminum substrate post treated with PVPA using a #3 RK wire wound rod (R.K. Print-Coat Instruments, UK). The resulting imageable elements were allowed to air dry.

Using the above formulation with polyurethane P4 and a variety of polymeric binders, coating integrity was determined by applying and then immediately removing a strip of cellophane tape. Each plate was then rated by how much coating was removed by the tape, with 1=no coating removed, and 5=all coating removed. Results are shown in Table 4.

TABLE 4

| Example | Binder | Coating Integrity |
|---|---|---|
| 2 | None | 4 |
| 16 | Polyvinylpyrrolidone-co-vinylacetate | 3 |
| 17 | Polyvinylpyrrolidone | 2 |
| 18 | Copolymer 845 | 2 |
| 19 | MOWIOL ® 3-83 | 2 |
| 20 | Polyvinylimidazole | 1 |
| 21 | ALCOTEX ® 864 | 2 |
| 22 | ALCOTEX ® 975 | 2 |
| 23 | Polyacrylamide | 2 |
| 24 | Polyacrylic acid | 2 |

Examples 25–32

Using the same general formulation as in Examples 16–24, imageable elements were prepared using various polyurethanes and polymeric binders. The imageable elements were imaged as in Example 1 at an exposure of 300 $cm^2$. The imaged imageable elements were placed on an offset printing press with a commercial fountain and black ink. The non-image area of the plates was removed after several revolutions of the fountain and/or ink rollers, and good prints were produced by the $25^{th}$ impression. The run length for each plate is indicated below. Results are shown in Table 5.

TABLE 5

| Example | Polyurethane | Binder | Run length |
|---|---|---|---|
| 19 | P4 | MOWIOL ® 3-83 | 2,000 |
| 25 | P4 | AIRVOL ® 203 | 5,000 |
| 26 | P4 | AIRVOL ® 523 | 1,000 |
| 27 | P4 | MOWIOL ® 4-98 | 12,000 |
| 28 | P7 | MOWIOL ® 3-83 | 10,000 |
| 29 | P12 | MOWIOL ® 3-83 | 5,000 |
| 30 | P13 | MOWIOL ® 3-83 | >30,000 |
| 31 | P14 | MOWIOL ® 3-83 | >30,000 |
| 32 | P15 | MOWIOL ® 3-83 | 10,000 |

Examples 33–40

Imageable elements were prepared as in Examples 16–24 and imaged as in Example 1 at an exposure energy of 300 $mJ/cm^2$. The compositions are given in Table 6. The imaged imageable elements were placed on a duplicator press for 250 impressions. Examples 33–40 below all resulted in good prints.

TABLE 6

| Example | Polyurethane | Binder |
|---|---|---|
| 33 | P1 | S-LEC ® K KW-1 |
| 34 | P1 | POVAL ® C-506 |
| 35 | P2 | S-LEC ® K KW-1 |
| 36 | P2 | POVAL ® C-506 |
| 37 | P4 | S-LEC ® K KW-1 |
| 38 | P4 | S-LEC ® K KW-3 |
| 39 | P14 | POVAL ® C-506 |
| 40 | P14 | POVAL ® KL-506 |

Example 41

This example illustrates processing and gumming of the imaged imageable element before placing it on the press. The dry imageable element was imaged at exposure energies of 300, 400, and 500 $mJ/cm^2$. The imaged imageable element was processed through only the rinse and gum sections of a Kodak 85 N processor at 0.82 m/min (2.7 ft/min). The rinse section contained water and the gum section contained Kodak Polychrome Graphics 850S plate finisher. The non-imaged regions of the imaged imageable element were partially removed when the element exited the processor. The resulting printing plate was placed on a duplicator press for 250 impressions and produced good prints at all three exposure energies.

Example 42

This example illustrates imaging of an imageable element of the invention with a thermal head. The procedure of Example 6 was repeated except that the substrate was an about 100 micron thick polyester sheet instead of aluminum. The resulting imageable element was imaged with an OYO Instruments model GS 618 Thermal Imagesetter (Qyo Instruments, Houston, Tex., USA) and produced a latent image as determined by bleaching of the infrared absorber and the decreased water solubility of the imaged areas.

Having described the invention, we now claim the following and their equivalents.

What is claimed is:

1. An imageable element comprising:

a substrate; and a layer of an imageable composition over the substrate; in which:

the imageable composition comprises:

a photothermal conversion material, and particles of a polyurethane polymer;

the polyurethane polymer comprises urethane linkages in the main chain;

the polyurethane polymer does not comprise side chain urethane groups;

the polyurethane polymer is prepared by reaction of a diisocyanate and a dihydroxy compound, and the dihydroxy compound comprises about 1–25% of a carboxy functional diol or a mixture of carboxy functional diols.

2. The element of claim 1 in which the dihydroxy compound comprises about 3–15% of the carboxy functional diol or mixture of carboxy functional diols, about 0–50% of an aromatic diol or mixture of aromatic diols, and about 35–97% of an aliphatic diol or mixture of aliphatic diols.

3. The element of claim 1 in which the polyurethane polymer comprises blocking groups.

4. The element of claim 1 in which the polyurethane polymer does not comprise blocking groups.

5. The element of claim 1 in which the imageable layer comprises, based on the dry weight of the imageable layer: about 80% to about 99% of the polyurethane particles, based on the dry weight of the particles; about 0.01% to about 5% of a surfactant or mixture of surfactants; and about 0.5% to about 20% of the infrared absorber or mixture of infrared absorbers.

6. The element of claim 5 which the dihydroxy compound comprises about 3–15% of the carbaxy functional diol or mixture of carboxy functional diols, about 0–50% of an aromatic diol or mixture of aromatic diols, and about 35–97% of an aliphatic dial or mixture of aliphatic diols.

7. The element of claim 6 in which the imageable layer comprises: about 85% to about 95% of the polyurethane particles, based on the dry weight of the particles; about 0.1% to about 1% of the surfactant or mixture of surfactants; and about 1% to about 15% of the infrared absorber or mixture of infrared absorbers; and the polyurethane particles have a diameter of 0.01–0.5 micrometers.

8. The element of claim 6 in which the carboxyl functional diol or mixture of carboxyl functional diols is selected from the group consisting of 2,2-bis(hydroxymethyl) propionic acid, 2,2-dimethylol propanoic acid), 2,2-bis(2-hydroxyethyl) propionic acid, 2,2-bis(3-hydroxypropyl) propionic acid, bis(hydroxymethyl)acetic acid, bis(4-hydroxyphenyl)acetic acid, 2,2-bis(hydroxymethyl) butyric acid, 2,2-bis(hydroxymethyl) pentanoic acid, tartaric acid, and mixtures thereof.

9. The element of claim 1 in which the imageable layer additionally comprises a water soluble polymer or a mixture of water soluble polymers.

10. The element of claim 9 in which the imageable layer comprises: about 60% to about 95% of the polyurethane particles, based an the dry weight of the particles; about 0.01% to about 5% of a surfactant or mixture of surfactants; about 0.5% to 20% of the infrared absorber or mixture of infrared absorbers; and about 3% to 30% of the water soluble polymer or mixture of water soluble polymers.

11. The element of claim 10 in which the dihydroxy compound comprises about 3–15% of the carboxy functional diol or mixture of carboxy functional diols, about 0–50% of an aromatic diol or mixture of aromatic diols, and about 35–97% of an aliphatic diol or mixture of aliphatic diols.

12. The element of claim 11 in which the imageable layer comprises, based on the dry weight of the imageable layer: about 70% to about 90% of the polyurethane particles, based on the dry weight of the particles; about 0.1% to about 1% of the surfactant or mixture of surfactants; about 1% to about 15% of the infrared absorber or mixture of infrared absorbers; and about 5% to about 20% of the water soluble polymer or mixture of water soluble polymers; and the polyurethane particles have a diameter of 0.01–0.5 micrometers.

13. The element of claim 1 in which at least one end of the polyurethane polymer is either a blocking group or an amine group.

14. The element of claim 1 in which both ends of the polyurethane polymer are each either a blocking group or an amine group.

15. The element of claim 14 in which the dihydroxy compound comprises about 3–15% of a carboxy functional diol or mixture of carboxy functional diols, about 0–50% of an aromatic diol or mixture of aromatic diols, and about 35–97% of an aliphatic diol or mixture of aliphatic diols.

16. The element of claim 15 in which the imageable layer additionally comprises a water soluble polymer or a mixture of water soluble polymers.

17. The element of claim 1 in which the polyurethane polymer is not crosslinked.

18. The element of claim 17 in which the imageable layer additionally comprises a water soluble polymer or a mixture of water soluble polymers.

19. A method for forming an image, the method comprising the steps of:

(a) thermally imaging an imageable element to produce an imaged imageable element comprising imaged regions and unimaged regions in the layer of imageable composition, the imageabie element comprising:

a substrate; and a layer of an imageable composition over the substrate; in which:

the imageabie composition comprises:

a photothermal conversion material, and particles of a polyurethane polymer;

the polyurethane polymer comprises urethane linkages in the main chain;

the polyurethane polymer does not comprise side chain urethane groups;

the polyurethane polymer is prepared by reaction of a diisocyanate and a dihydroxy compound, and the dihydroxy compound comprises about 1–25% of a carboxy functional diol or a mixture of carboxy functional diols;

(b) developing the imaged imageable element by applying fountain solution and lithographic ink to the layer of imageable composition, removing the unimaged regions, and forming the image.

20. The method of claim 19 in which the imageabie layer comprises, based on the dry weight of the imageable layer: about 80% to about 99% of the polyurethane particles, based on the dry weight of the particles; about 0.01% to about 5% of a surfactant or mixture of surfactants; and about 0.5% to about 20% of the infrared absorber or mixture of infrared absorbers.

21. The method of claim 20 in which the dihydroxy compound comprises about 3–15% of the carboxy functional diol or mixture of carboxy functional diols, about 0–50% of an aromatic diol or mixture of aromatic diols, and about 35–97% of an aliphatic diol or a mixture of aliphatic diols.

22. The method of claim 21 in which the imageable layer comprises: about 85% to about 95% of the polyurethane particles, based on the dry weight of the particles; about 0.1% to about 1% of the surfactant or mixture of surfactants; and about 1% to about 15% of the infrared absorber or mixture of infrared absorbers; and the polyurethane particles have a diameter of 0.01–0.5 micrometers.

23. The method of claim 19 in which the imageable layer additionally comprises a water soluble polymer or a mixture of water soluble polymers.

24. The method of claim 23 in which the imageable layer comprises: about 60% to about 95% of the polyurethane particles, based on the dry weight of the particles; about 0.01% to about 5% of a surfactant or mixture of surfactants; about 0.5% to 20% of the infrared absorber or mixture of infrared absorbers; and about 3% to 30% of the water soluble polymer or mixture of water soluble polymers.

25. The method of claim 24 in which the dihydroxy compound comprises about 3–15% of the carboxy functional diol or mixture of carboxy functional diols, about 0–50% of an aromatic diol or mixture of aromatic diols, and about 35–97% of an aliphatic diol or mixture of aliphatic diols.

26. The method of claim 25 in which the imageable layer comprises, based on the dry weight of the imageable layer: about 70% to about 90% of the polyurethane particles, based on the dry weight of the particles; about 0.1% to about 1% of the surfactant or mixture of surfactants; about 1% to about 15% of the infrared absorber or mixture of infrared absorbers; and about 5% to about 20% of the water soluble polymer or mixture of water soluble polymers; and the polyurethane particles have a diameter of 0.01–0.5 micrometers.

27. The method of claim 26 additionally comprising, after step (b), (c) applying a fountain solution and then a lithographic ink to the image, forming an ink image, and transferring the ink image to a receiver.

28. The method of claim 19 in which the polyurethane polymer is not crosslinked.

29. The method of claim 28 in which the imageable layer additionally comprises a water soluble polymer or a mixture of water soluble polymers.

30. An imageable element comprising:

a substrate; and a layer of an imageable composition over the substrate;

in which:

the imageable composition comprises:

a photothermal conversion material, and particles of a polyurethane polymer;

the polyurethane polymer comprises urethane linkages in the main chain;

the polyurethane polymer does not comprise side chain urethane groups;

the particles consist essentially of the polyurethane polymer;

the polyurethane polymer is prepared by reaction of a diisocyanate and a dihydroxy compound; and the dihydroxy compound comprises about 1–25% of a carboxy functional diol or a mixture of carboxy functional diols.

31. The element of claim 30 in which the imageable layer comprises, based on the dry weight of the imageable layer: about 80% to about 99% of the polyurethane particles, based on the dry weight of the particles; about 0.01% to about 5% of a surfactant or mixture of surfactants; and about 0.5% to about 20% of the infrared absorber or mixture of infrared absorbers.

32. The element of claim 31 in which the imageable layer comprises: about 85% to about 95% of the polyurethane particles, based on the dry weight of the particles; about 0.1% to about 1% of the surfactant or mixture of surfactants; and about 1% to about 15% of the infrared absorber or mixture of infrared absorbers; and the polyurethane particles have a diameter of 0.01–0.5 micrometers.

33. The element of claim 30 in which the imageable layer additionally comprises a water soluble polymer or a mixture of water soluble polymers.

34. The element of claim 33 in which the imageable layer comprises: about 60% to about 95% of the polyurethane particles, based on the dry weight of the particles; about 0.01% to about 5% of a surfactant or mixture of surfactants; about 0.5% to 20% of the infrared absorber or mixture of infrared absorbers; and about 3% to 30% of the water soluble polymer or mixture of water soluble polymers.

35. The element of claim 34 in which the imageable layer comprises, based on the dry weight of the imageable layer: about 70% to about 90% of the polyurethane particles, based on the dry weight of the particles; about 0.1% to about 1% of the surfactant or mixture of surfactants; about 1% to about 15% of the infrared absorber or mixture of infrared absorbers; and about 5% to about 20% of the water soluble polymer or mixture of water soluble polymers; and the polyurethane particles have a diameter of 0.01–0.5 micrometers.

36. The element of claim 30 in which the polyurethane polymer is not crosslinked.

37. A method for forming an image, the method comprising the steps of:

(a) thermally imaging an imageable element to produce an imaged imageable element comprising imaged regions and unimaged regions in the layer of imageable composition, the imageable element comprising:

a substrate; and a layer of an imageable composition over the substrate;

in which:

the imageable composition comprises:

a photothermal conversion material, and particles of a polyurethane polymer;

the polyurethane polymer comprises urethane linkages in the main chain;

the polyurethane polymer does not comprise side chain urethane groups;

the particles consist essentially of the polyurethane polymer;

the polyurethane polymer is prepared by reaction of a diisocyanate and a dihydroxy compound; and the dihydroxy compound comprises about 1–25% of a carboxy functional diol or a mixture of carboxy functional diols;

(b) developing the imaged imageabie element by applying fountain solution and lithographic ink to the layer of imageable composition, removing the unimaged regions, and forming the image.

38. The method of claim 37 in which the imageable layer comprises, based on the dry weight of the imageable layer: about 80% to about 99% of the polyurethane particles, based on the dry weight of the particles; about 0.01% to about 5% of a surfactant or mixture of surfactants; and about 0.5% to about 20% of the infrared absorber or mixture of infrared absorbers.

39. The method of claim 37 in which the imageable layer additionally comprises a water soluble polymer or a mixture of water soluble polymers.

40. The method of claim 39 in which the imageable layer comprises: about 60% to about 95% of the polyurethane particles, based on the dry weight of the particles; about 0.01% to about 5% of a surfactant or mixture of surfactants; about 0.5% to 20% of the infrared absorber or mixture of infrared absorbers; and about 3% to 30% of the water soluble polymer or mixture of water soluble polymers.

* * * * *